US006970687B1

(12) United States Patent
Kluge et al.

(10) Patent No.: US 6,970,687 B1
(45) Date of Patent: Nov. 29, 2005

(54) MIXER

(75) Inventors: Wolfram Kluge, Dresden (DE); Dietmar Eggert, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 503 days.

(21) Appl. No.: 09/904,951

(22) Filed: Jul. 13, 2001

(51) Int. Cl.[7] .................................................. H04B 1/10

(52) U.S. Cl. ...................... 455/323; 455/326; 455/314; 455/333

(58) Field of Search ................................ 455/313, 314, 455/315, 323, 324, 326, 112, 113, 118, 296, 455/318, 319, 333; 327/113, 116, 119

(56) References Cited

U.S. PATENT DOCUMENTS

| | | | | |
|---|---|---|---|---|
| 5,303,417 A | | 4/1994 | Laws | 455/314 |
| 5,589,791 A | * | 12/1996 | Gilbert | 327/359 |
| 6,029,059 A | * | 2/2000 | Bojer | 455/326 |
| 6,104,227 A | * | 8/2000 | Durec et al. | 327/359 |
| 6,144,845 A | * | 11/2000 | Durec | 455/285 |
| 6,144,846 A | * | 11/2000 | Durec | 455/323 |
| 6,370,372 B1 | | 4/2002 | Molnar et al. | 455/323 |
| 6,748,204 B1 | * | 6/2004 | Razavi et al. | 455/296 |

FOREIGN PATENT DOCUMENTS

| | | | |
|---|---|---|---|
| GB | 2 192 104 A | 6/1986 | H04B 1/30 |

OTHER PUBLICATIONS

International PCT Search Report PCT/US 02/21251 dated Apr. 4, 2003.

* cited by examiner

*Primary Examiner*—Edward F. Urban
*Assistant Examiner*—Blane J. Jackson
(74) *Attorney, Agent, or Firm*—Williams, Morgan & Amerson

(57) ABSTRACT

The invention provides a mixer comprising a multiplier circuit having a first and a second mixer, a generator for generating two first and two second control signals for controlling the first and second mixers, wherein the first and second control signals are in each case balanced signals and the first control signals have a frequency $f_1$ and the second control signals have a different frequency $f_2$.

18 Claims, 5 Drawing Sheets

MIXER

BACKGROUND OF THE INVENTION

1. Field of the Invention

This invention relates generally to transceivers, and, more particularly, to a mixer for use in a transceiver.

2. Description of the Related Art

The increasing demand for portable wireless communication devices having low price, weight and size and improved capabilities is prompting research in new IC (integrated circuit) technologies, circuit configurations and transceiver architectures. Transceiver implementations for wide band systems comprising direct conversion mixers are known and meet the above mentioned requirements better than architectures based on the widely used super-heterodyne principle.

At the transmitter stage of the transceiver, direct conversion mixers are used to up-convert a baseband analog or digital signal to an RF (radio frequency) signal for ease of transmission. At the receiver stage, direct conversion mixers are used to down-convert a received RF signal to baseband for ease of signal processing. Therefore, no high-Q filters and high-Q image rejection filters are necessary for image rejection and IF (intermediate frequency) filtering. Generally, it is difficult to integrate high-Q filters. Such receivers are also called zero-IF receivers, since the wanted signal is directly down-converted to the base-band and the IF is chosen to be zero. The mixers used therein commutate the amplified RF signal with the LO (local oscillator) signal. For example, in the often-used bipolar mixer based on the Gilbert analog multiplier, a current-mode commutation is performed. This multiplier is also called Gilbert cell, which is a cross-coupled differential amplifier.

For such direct conversion topologies, several problems like carrier leakage, second order intermodulation, and interference between local oscillator and RF signals exist.

Especially direct conversion receivers require a high degree of linearity of the mixer stage, since second order spurious products fall directly into the obtained baseband frequency and disturb the desired signal. The main reason for such second order mixer non-linearity is based on signal cross talk between the input signals of the mixer. Generally, this will lead to signal self-mixing effects causing DC (direct current) offset. However, this DC offset is not constant.

Further problems in state of the art transceiver architectures are pulling effects. In principal, such effects can be prevented by isolating the VCO (Voltage Controlled Oscillator) generating the LO signal from all other signals. However, isolation is a problem for architectures where the VCO is operating at the transmit frequency, i.e., FM (frequency modulation) systems using direct modulation of the VCO or a direct up-conversion principle. In such transceiver architectures, the power amplifier (PA) or a power pre-amplifier generates strong signals on the chip at the same frequency the on-chip VCO is operating at. The same problem occurs if strong signals are applied to the Rx (receive) input. VCO pulling is caused by non-perfect isolation, i.e., in transceiver topologies where the VCO is running at the same frequency as the Tx (transmit) output and the Rx input are operated. In modern transceiver architectures it is desirable to reduce such effects.

In state of the art receivers, the incoming RF signal is multiplied by a sinusoid signal derived from a local oscillator (LO signal). Both signals may be represented by a voltage or a current. The mixer performing the multiplication of both signals comprises two inputs that are practically not completely decoupled. Therefore, in addition to the wanted signal, each mixer input signal additionally contains a smaller cross-coupled portion of the other signal. Due to the multiplying property of the mixer, the output signal contains spurious signals, which are proportional to the power of the received signal centered around DC. These spurious signals are especially disadvantageous for the direct conversion principle, since the desired down-converted RF signal is also centered at a frequency of f=0.

The present invention solves, or at least reduces, some or all of the aforementioned problems.

SUMMARY OF THE INVENTION

The present invention provides a mixer comprising a multiplier circuit having a first and a second mixer, a generator for generating two first and two second control signals for controlling the first and second mixers, wherein the first control signals have a frequency $f_1$ and the second control signals have a different frequency $f_2$.

Preferably, the first and second control signals are balanced signals. Alternatively, the first and second control signals are single-ended signals.

The present invention also provides a mixer for I/Q quadrature signal generation comprising a first multiplier circuit having a first and a second mixer, a second multiplier circuit having a third and a fourth mixer, and a generator for generating two first and two second control signals for controlling the first and second mixers and two third and fourth control signals for controlling the third and fourth mixers, wherein the first, second, third and fourth control signals are in each case balanced signals, the first and third control signals have a frequency $f_1$ and the second and fourth control signals have a different frequency $f_2$, and either the signals at frequency $f_1$ or at frequency $f_2$ are provided in four phases each shifted by $\pi/2$.

In one embodiment of the invention, the first and second multiplier circuits comprise a Gilbert cell, where all transistors are used as switches and the generator comprises a frequency derivation circuit.

In another embodiment of the invention, the frequency of the signal mixed with the mixer input signal is different from the operation frequency of said generator.

In a further embodiment of the invention, the frequency derivation within the frequency derivation circuit is executed using either frequency division or frequency multiplication and voltages or currents within the circuit avoid the sum frequency $f_1+f_2$.

In another embodiment of the invention, voltages or currents within the circuit avoid the difference frequency $f_1-f_2$.

The inventive mixer principle is based on the idea that for a direct conversion mixer architecture, there is no need to have the VCO operating at the same frequency as the mixer input signal (direct down-conversion receiver) or as the mixer output signal (direct up-conversion transmitter) as long as the required frequency can be derived directly within the mixer. Although, the control signals are preferably generated by means of a VCO, the present invention is not limited to a topology comprising a VCO. The control signals may also be generated by other devices known in the art.

Principally, the following mathematical relations are used: Consider two signals $u_{VCO1}=u_1 \cos 2\pi f_1 t$ and $u_{VCO2}=u_2 \cos 2\pi f_2 t$. If both signals are multiplied, the following signal $u_{MIX}=G_{MIX}\cdot u_{VCO1}\cdot u_{VCO2}$ can be derived, wherein $G_{MIX}$ is an amplification factor:

$$u_{MIX} = G_{MIX} u_1 \cos(2\pi f_1 t) \cdot u_2 \cos(2\pi f_2 t) \quad (1)$$
$$= \frac{1}{2} G_{MIX} u_1 u_2 (\cos 2\pi(f_1 - f_2)t + \cos 2\pi(f_1 + f_2)t)$$

The frequency sum ($f_1+f_2$) is used as the required dependence occurring as a time-dependent resistance, but not as voltage or current. It is generated by mixing signals having different frequencies. Therefore, $f_1$ and $f_2$ have to be selected so that additionally generated mixing products or its harmonics are as far as possible away from the sum frequency.

In general, every frequency ratio $f_1/f_2$ can be used for this principle. It is possible to generate each frequency by a separate VCO. However, with respect to minimization of the necessary circuitry, it is preferable to derive both frequencies from one VCO using frequency dividers or frequency multipliers.

For example, there are two possibilities to generate a 2.5 GHz periodic dependence. In the following table, the frequencies $f_1$, $f_2$ and $f_1+f_2$ are depicted:

| Example # | $f_1$ [GHz] | $f_2$ [GHz] | $f_1 + f_2$ [GHz] |
|---|---|---|---|
| I | 1.0 | 1.5 | 2.5 |
| II | 0.833 | 1.666 | 2.499 |

As shown in the following table, in both examples it is easily possible to derive the required signals with the desired frequency out of one base (VCO) signal by two division operations.

| Example # | $f_{VCO}$ [GHz] | Operation (1st step) | $f_1$ [GHz] | Operation (2nd step) | $f_2$ [GHz] |
|---|---|---|---|---|---|
| I | 3.0 | Divide by 3 | 1.0 | Divide by 2 | 1.5 |
| II | 1.666 | Divide by 2 | 0.833 | 1:1 | 1.666 |

Since the present invention avoids circuit nodes carrying signals at the sum frequency, cross coupling and self mixing effects are eliminated.

Because of the above-explained general principle, this invention may be utilized in direct conversion receivers as well as in direct conversion transmitters.

BRIEF DESCRIPTION OF THE DRAWINGS

The invention may be understood by reference to the following description taken in conjunction with the accompanying drawings, in which like reference numerals identify like elements, and in which.

Figure 1:
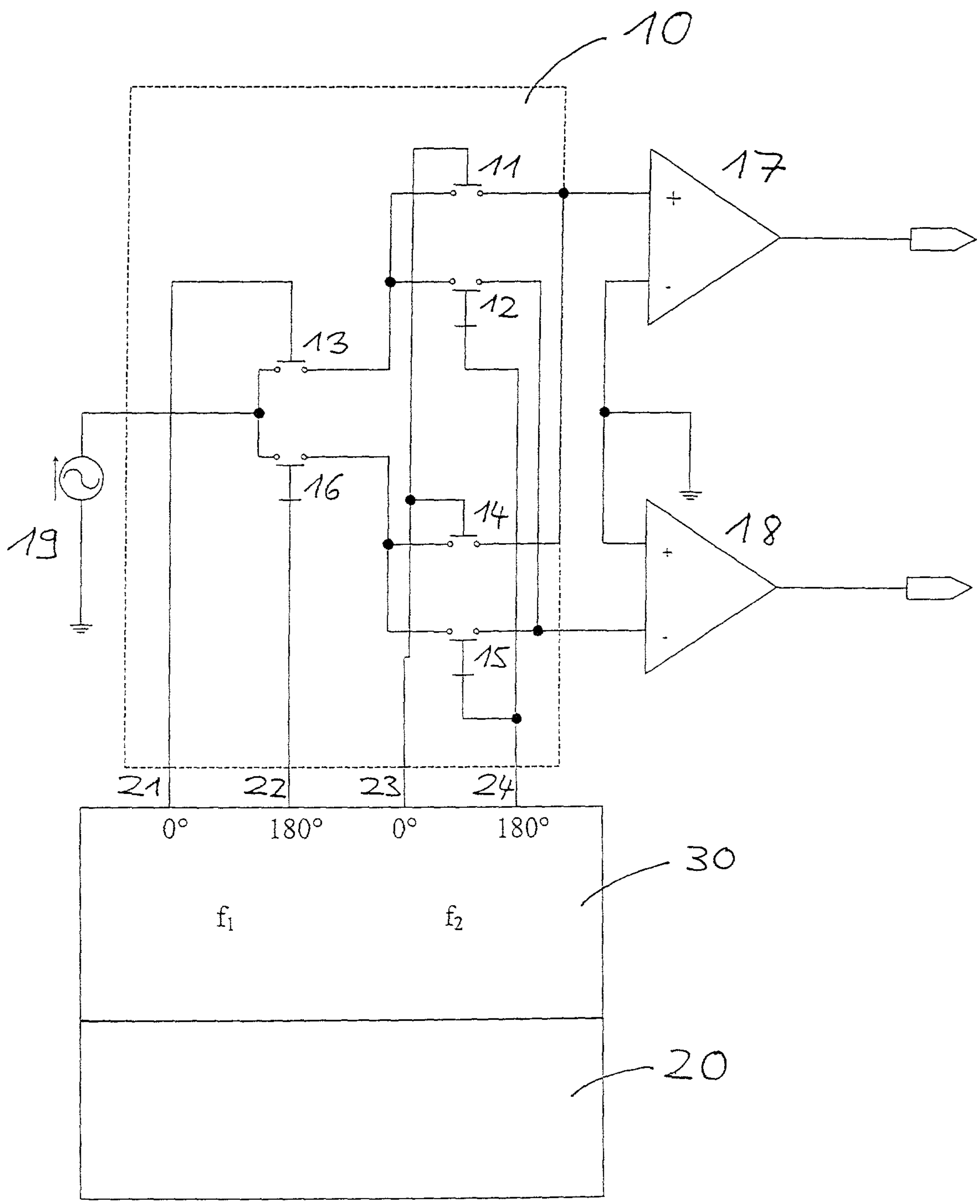
FIG. 1 is a circuit diagram of a mixer according to the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention.

Referring now to FIG. 1, a schematic circuit diagram of a preferred embodiment of the mixer according to the present invention is illustrated. As shown in FIG. 1, the circuit comprises a switching network 10, a VCO 20, a frequency derivation circuit 30 and two output operational amplifiers 17, 18. The input signal 19 is an RF signal with the frequency $f_0$. The switching topology shown is essentially a Gilbert cell providing a balanced architecture for the four VCO signals 21, 22, 23 and 24. In the following, the term Gilbert cell is used for a Gilbert cell-like switching topology, where all transistors are used as switches. As shown in FIG. 1, the Gilbert cell mixer has a first mixing stage comprising two field-effect transistors (FETs) 13 and 16 and a second mixing stage comprising four FETs 11, 12, 14 and 15. More particularly, the Gilbert cell circuit includes two FETs 111 and 12 whose sources are connected to FET 13, and two FETs 14, 15 whose sources are connected to FET 16. LO signals are applied to all gates of the FETs. The LO signals 21 and 22 applied to the gates of FETs 13 and 14 are balanced signals. Similarly, the LO signals 23 and 24 applied to the gates of FETs 11, 12 and 14, 15 are balanced signals. It has to be noted that signal 23 is applied to the gates of FETs 11 and 14 and signal 24 is applied to the gates of FETs 12 and 15. Additionally, as can be seen from FIG. 1, the LO signals applied to the FET gates of mixing stage one have a frequency $f_1$ and the LO signals applied to the FET gates of mixing stage two have a frequency $f_2$. FET 14 has a drain connected to the drain of FET 11, which is connected to the positive input of output amplifier 17. Similarly, FET 12 has a drain connected to the drain of FET 15, which is connected to the negative input of output amplifier 18. The negative input of the operational amplifier 17 is coupled to the positive input of the operational amplifier 18 and together they are coupled to ground. The output signals of the Gilbert cell are detected by these fully differential operational amplifiers 17, 18, which are suppressing the RF in the further signal path by their CMRR (common mode rejection ratio). The frequency derivation circuit 30 is realizing the above-explained derivation of signals having the frequencies $f_1$ and $f_2$ out of one signal. Although, only a FET realization is shown, depending on the technology being used, the switches may also be bipolar transistors.

The drain source resistance is controlled by the periodic gate voltage, which is the LO signal ringing at frequency $f_1$ (first mixer stage) and at frequency $f_2$ (second mixer stage). Since there is no bias current applied to the transistors, the mixing frequency $f_1+f_2$ does not exist as current or as voltage. The transistor drain source resistance is ringing with the desired frequency to switch the single-ended RF signal to the balanced outputs.

The essential advantage of using the inventive topology in the described way is that the node voltages and branch currents do only exist at the applied frequencies $f_1$ and $f_2$. Due to its symmetric rectangular characteristics, there are odd harmonics of these frequencies, however, no spectral components at the sum frequency occur. The incoming RF signal is converted by means of a time dependent resistor (switch) characteristic, which has a strong spectral content at the desired input frequency, but no spectral content at either the derived frequency $f_1+f_2$ or at the VCO frequency.

The circuit depicted in FIG. 1 operates in voltage mode. Therefore, an input signal voltage source and high input impedance of the operational amplifiers are required. The same FET switching network may also be operated in current mode. For that, an input signal current would be switched to the low impedance nodes of the output operational amplifiers.

Figure 2:
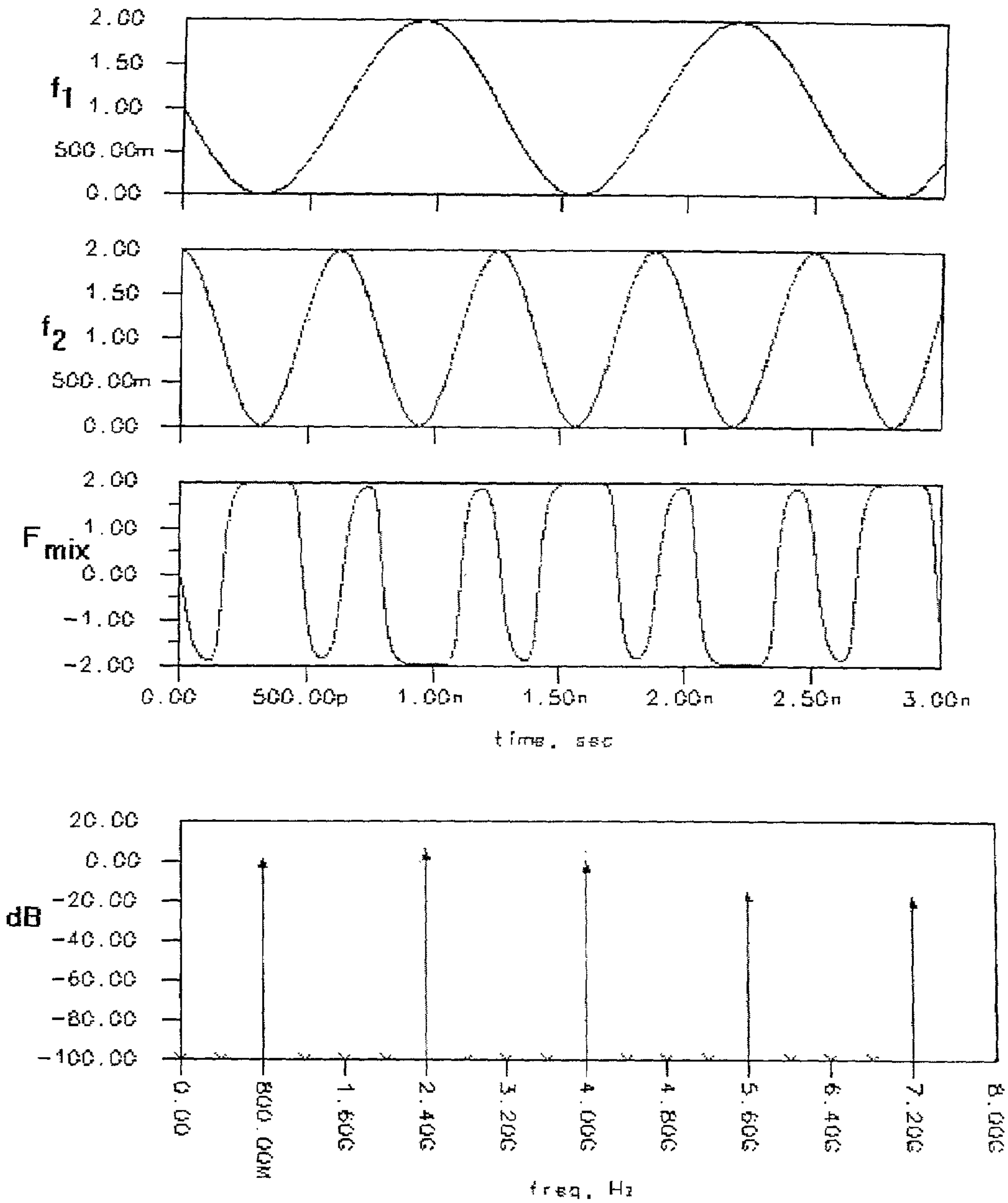
FIG. 2 shows four diagrams. The first and second diagrams depict the two control signals having the frequencies $f_1$ and $f_2$. The third diagram depicts the conductance characteristic of the Gilbert cell circuit denoted as transfer function $F_{mix}$ and the fourth diagram depicts the spectrum of the transfer function $F_{mix}$.

Referring now to FIG. 2, in the first and second diagram of FIG. 2, the sinusoidal control signals at frequencies $f_1$=800 MHz and $f_2$=1600 MHz are shown. The conductance characteristic (denoted as transfer function $F_{mix}$), which can be seen from the positive inputs of the operational amplifiers 17 and 18 into the Gilbert cell is shown in the third diagram of FIG. 2. This function is simulated by injecting a 1 mA DC current at the Gilbert cell input and the differential output current is sensed with 2 kOhm resistors at the positive inputs of the operational amplifiers 17 and 18. In the last diagram of FIG. 2, the spectrum of the transfer function $F_{mix}$ is shown. Therein, a spectral component at the sum frequency $f_1+f_2$ dominates this characteristic, which will be used to convert the desired RF signal. The other spectral lines cause receiver spurious responses similar to images in the superheterodyne receiver. These image response frequencies are far enough apart from the desired frequency at 2400 MHz so that a usually used system band-pass filter installed in front of the receiver will suppress them.

All spectrum lines having a higher frequency than the sum frequency of 2400 MHz occur due to the limiting behavior of the switches, which form a square wave resistance dependence in the MOS (Metal Oxide Semiconductor) transistors. These square waves are comprising odd harmonics, which are also mixed with each other causing harmonics in the transfer function. They are spaced apart by 1600 MHz.

Inherent in the chosen architecture is that neither the VCO signal itself nor its derived components at the double frequency nor the incoming signals, here described as RF signals, appears at the output in differential mode. The 800 MHz spectral line of the last diagram of FIG. 2 is caused by the difference frequency $f_2-f_1$ and not by the control signal having the same frequency $f_1$.

Modern transceiver architectures require complex signal processing. Therefore, a signal path for an inphase (I) component and for a quadrature (Q) phase component has to be provided. To implement such architecture, one of the two signals, either the one at the frequency $f_1$ or the one at $f_2$ has to be provided in four phases, each shifted by 90 degrees in phase.

Figure 3:
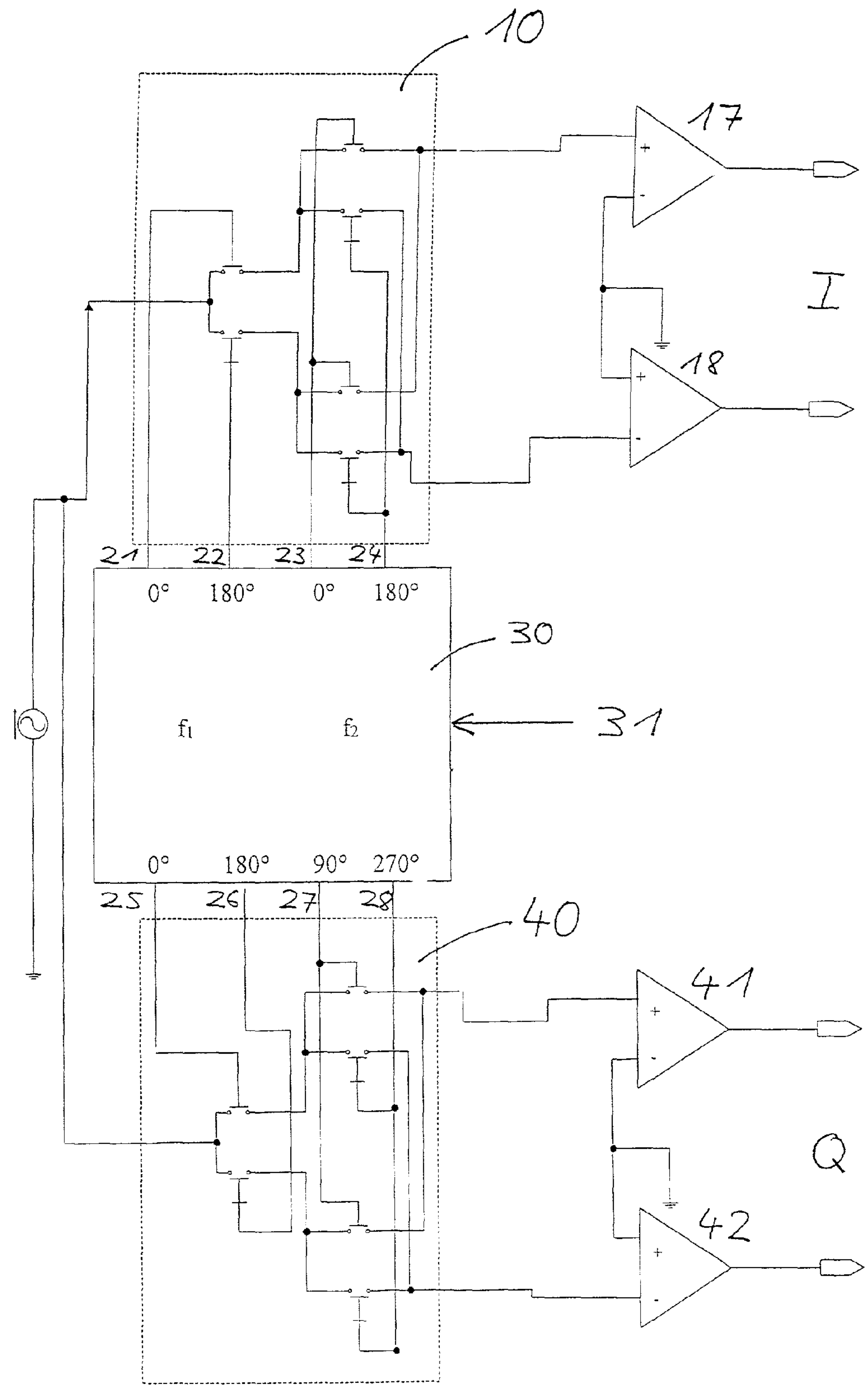
FIG. 3 is a circuit diagram of an I/Q quadrature phase implementation of a mixer according to the present invention.

FIG. 3 shows a circuit diagram of such an I/Q quadrature phase implementation of a mixer. This I/Q path realization includes a first Gilbert cell circuit 10 for providing I− signals, a second Gilbert cell circuit 40 for providing Q− signals, four output operational amplifiers 17, 18, 41 and 42 and a frequency derivation circuit 30. The Gilbert cell circuits 10 and 40 are equivalent to the Gilbert cell circuit of FIG. 1. In this regard, reference is made to the corresponding description of FIG. 1. Frequency derivation circuit 30 provides four control signals 21, 22, 23 and 24 for the first Gilbert cell mixer and four control signals 25, 26, 27 and 28 for the second Gilbert mixer. The signals 21, 22, 25 and 26 have a frequency $f_1$ and the signals 23, 24, 27 and 28 have a frequency $f_2$. As shown in FIG. 1, the signals 21 and 22, 23 and 24, 25 and 26, 27 and 28 are in each case balanced signals. Moreover, the control signals at frequency $f_2$ are provided in four phases each shifted by 90 degrees. Generation of the desired eight control signals with the frequencies $f_1$ and $f_2$ out of one signal 31 having the frequency $f_{VCO}$ is realized within the frequency derivation circuit 30 as described above. In FIG. 3, the operational amplifiers 17 and 18 are providing the I+ and I− signal and the operational amplifiers 41 and 42 are providing the Q+ and Q− signal. Although, a FET realization is shown, the switches may also be bipolar transistors.

In order to cancel the difference frequency $f_1-f_2$, an image-rejection principle may be used, which leads to filtering out the image frequency band.

A general realization problem is how to provide all the different signals with all the different phase angles. One answer to this question lies in the implementation of polyphase filters, which provide an exact phase shift of 90 degrees to the control signals. However, such a realization may lead to a possible amplitude imbalance, which has to be compensated within the circuit.

Figure 4:
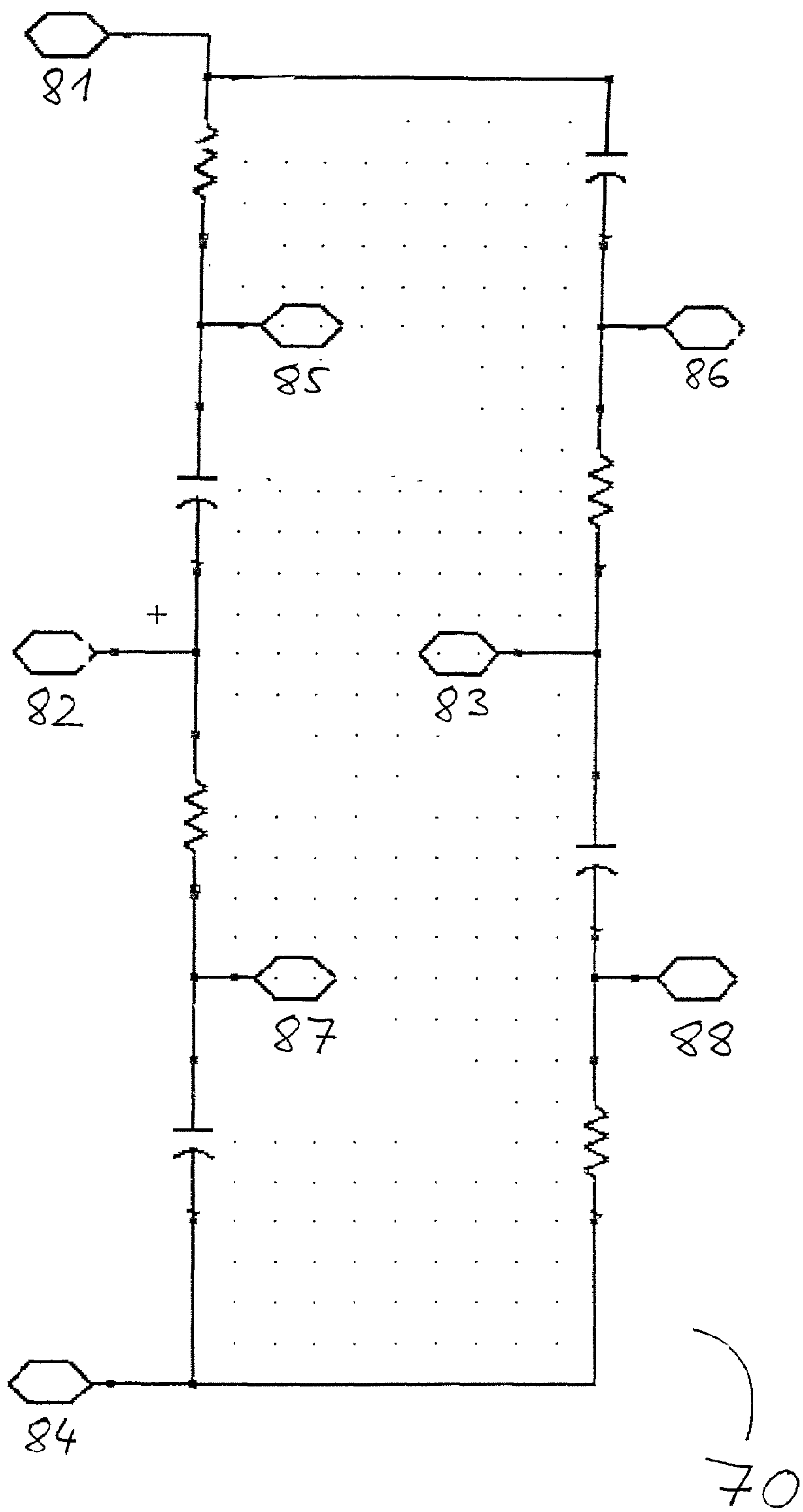
FIG. 4 is a circuit diagram of a polyphase filter according to the present invention providing four signals shifted by 90 degrees relative to each other.

A 90 degree polyphase filter 70 is depicted in FIG. 4. The input terminals are indicated with reference numbers 81, 82, 83 and 84 and the output terminals are indicated with reference numbers 85, 86, 87 and 88. The sizes of the resistors and capacitors in the polyphase filter 70 may be easily determined by the ordinarily-skilled artisan once a desired target frequency of operation is selected.

The proposed mixer structure can be used in the receiver as well as in the transmitter path of a transceiver. An advantage of the described approach is that the circuitry, which is necessary to generate proper phased control signals at frequencies $f_1$ and $f_2$, can be used to drive both the receiver and the transmitter mixer.

Figure 5:
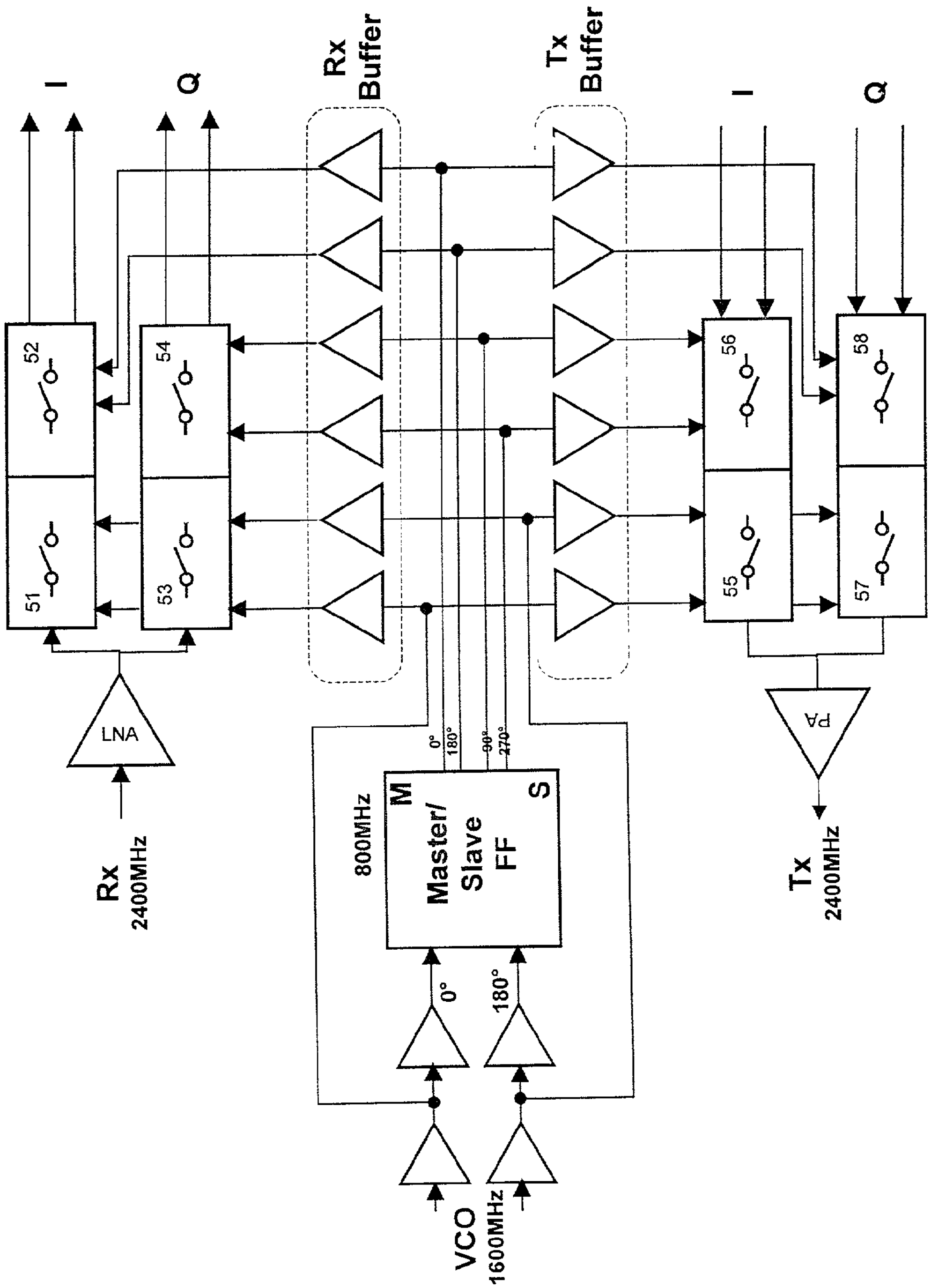
FIG. 5 is a block diagram of an RF front-end with I/Q signal generation for a 1600 MHz/800 MHz frequency ratio according to the present invention.

Referring now to FIG. 5, a block diagram of an RF front-end realization with I/Q signal generation for a 1600

MHz/800 MHz frequency ratio according to the present invention is shown. The RF front-end comprises a receiver section, a transmitter section and a control signal generation section. The receiver section comprises a receiver input Rx receiving a 2400 MHz signal, a Rx Buffer, four switches 51, 52, 53 and 54 and receiver outputs providing the I− and Q− signals. As depicted in FIG. 5, the control signals at a frequency of 1600 MHz are applied to switches 51, 53, 55 and 57 and the control signals at a frequency of 800 MHz are applied to switches 52, 54, 56 and 58. The phase positions of the control signals as indicated in FIG. 5 are corresponding to the inventive principle. Similar to the receiver section, the transmitter section comprises a transmitter output Tx transmitting a 2400 MHz signal, a Tx Buffer, four switches 55, 56, 57 and 58 and transmitter inputs receiving the I− and Q− data. The control signal generation section comprises a master/slave flip-flop generating four 800 MHz control signals provided in four phases each shifted by 90 degrees in phase out of the 1600 MHz VCO signals. These VCO signals are balanced and are also used as control signals for the switches 51, 53, 55 and 57. One particular implementation of the switches 51–58 comprises field effect transistors.

The present invention addresses an inherent problem of mixer realization for direct up- and down-conversion architectures, whereby no other implementation will lead to such performance with respect to linearity and suppression of LO signals. Furthermore, from a system architecture point of view, the hardness of the VCO signals in relation to the power amplifier signals is reasonably improved.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A mixer comprising:

a multiplier circuit having a first and a second mixer, the first mixer comprising a first number of transistors and the second mixer comprising a second number of transistors, the first number being different than the second number; and a generator for generating two first and two second control signals for controlling said first and second mixers, wherein said two first control signals have a frequency $f_1$ and said two second control signals have a different frequency $f_2$.

2. The mixer of claim 1, wherein said two first and two second control signals are balanced signals.

3. The mixer of claim 1, wherein said two first and two second control signals are single-ended signals.

4. The mixer of claim 1, wherein the first mixer comprises two transistors and the second mixer comprises four transistors.

5. The mixer of claim 1, wherein the two first control signals are complementary and the two second control signals are complementary.

6. The mixer of claim 1, wherein said multiplier circuit comprises a Gilbert cell having a plurality of transistors, where all transistors are used as switches.

7. A mixer for I/Q quadrature signal generation, comprising:

a first multiplier circuit having a first and a second mixer, the first mixer comprising a first number of transistors and the second mixer comprising a second number of transistors, the first number being different than the second number;

a second multiplier circuit having a third and a fourth mixer, the third mixer comprising a third number of transistors and the fourth mixer comprising a fourth number of transistors, the third number being different than the fourth number; and a generator for generating two first and two second control signals for controlling said first and second mixers and two third and two fourth control signals for controlling said third and fourth mixers, wherein said two first, two second, two third and two fourth control signals are in each case balanced signals, whereby said two first and two third control signals have a frequency $f_1$ and said two second and two fourth control signals have a different frequency $f_2$, and either said signals at frequency $f_1$ or at frequency $f_2$ are provided in four phases each shifted by $\pi/2$.

8. The mixer of claim 7, wherein said first and second multiplier circuits each comprise a Gilbert cell having a plurality of transistors, where all transistors are used as switches.

9. The mixer of claim 7, wherein said generator comprises a frequency derivation circuit.

10. The mixer of claim 4, wherein the frequencies $f_1$ and $f_2$ of said control signals differ from an operation frequency of said generator.

11. The mixer of claim 9, wherein the frequency derivation within said frequency derivation circuit is executed by using frequency division.

12. The mixer of claim 9, wherein the frequency derivation within said frequency derivation circuit is executed by using frequency multiplication.

13. The mixer of claim 11, wherein voltages or currents within the circuit avoid the sum frequency $f_1+f_2$.

14. The mixer of claim 11, wherein voltages or currents within the circuit avoid the difference frequency $f_1-f_2$.

15. The mixer of claim 7, wherein the first mixer comprises two transistors and the second mixer comprises four transistors.

16. The mixer of claim 7, wherein the third mixer comprises two transistors and the fourth mixer comprises four transistors.

17. The mixer of claim 7, wherein the two first control signals at frequency $f_1$ are complementary and the two third control signals at frequency $f_1$ are complementary.

18. The mixer of claim 7, wherein said control signals at frequency $f_2$ are provided in four phases each shifted by $\pi/2$.

* * * * *